United States Patent
Chia

(10) Patent No.: US 12,243,873 B2
(45) Date of Patent: Mar. 4, 2025

(54) INTEGRATED CIRCUIT HAVING THREE-DIMENSIONAL TRANSISTORS AND SEAL RING STRUCTURE WITH MONITORING PATTERN

(71) Applicant: Taiwan Semiconductor Manufacturing Company, Ltd., Hsinchu (TW)

(72) Inventor: Kuo-Yang Chia, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 743 days.

(21) Appl. No.: 17/488,830

(22) Filed: Sep. 29, 2021

(65) Prior Publication Data

US 2022/0352154 A1    Nov. 3, 2022

Related U.S. Application Data

(60) Provisional application No. 63/181,977, filed on Apr. 30, 2021.

(51) Int. Cl.
| | |
|---|---|
| *H01L 27/088* | (2006.01) |
| *H01L 21/8234* | (2006.01) |
| *H01L 27/06* | (2006.01) |
| *H01L 29/66* | (2006.01) |
| *H01L 29/78* | (2006.01) |

(52) U.S. Cl.
CPC .. *H01L 27/0886* (2013.01); *H01L 21/823431* (2013.01); *H01L 27/0688* (2013.01); *H01L 29/66795* (2013.01); *H01L 29/7851* (2013.01)

(58) Field of Classification Search
CPC ..... H01L 22/34; H01L 23/564; H01L 23/585; H01L 27/0886; H01L 29/785; H01L 29/7851; H01L 21/823431
See application file for complete search history.

(56) References Cited

U.S. PATENT DOCUMENTS

| | | | |
|---|---|---|---|
| 2014/0367835 A1 | 12/2014 | Wei et al. | |
| 2015/0255593 A1* | 9/2015 | Yu | H01L 29/6681 |
| | | | 257/401 |
| 2016/0172359 A1* | 6/2016 | Yoon | H01L 23/585 |
| | | | 257/401 |
| 2016/0211187 A1 | 7/2016 | Zhang et al. | |
| 2022/0293532 A1* | 9/2022 | Lee | H01L 23/562 |

FOREIGN PATENT DOCUMENTS

TW    201929179 A    7/2019

* cited by examiner

*Primary Examiner* — Tuan A Hoang
(74) *Attorney, Agent, or Firm* — Lippes Mathias LLP

(57) ABSTRACT

An integrated circuit (IC) manufacturing method includes: forming, in a device region of the semiconductor wafer, fins of fin field-effect transistors (finFETs) of the IC; forming, in a seal ring region surrounding the device region, at least one seal ring comprising fins encircling the device region and a monitoring pattern comprising fins encircling the device region; and forming, in the device region, gates of the finFETs of the IC. Polysilicon structures are formed on the fins of the monitoring pattern in a connecting region of the monitoring pattern. An epitaxial material is grown on the fins of the monitoring pattern between the polysilicon structures by a combination of epitaxial growth upward from the fins and epitaxial growth inward from the polysilicon structures. At least one electrical contact is formed that electrically contacts the epitaxial material.

20 Claims, 7 Drawing Sheets

INTEGRATED CIRCUIT HAVING THREE-DIMENSIONAL TRANSISTORS AND SEAL RING STRUCTURE WITH MONITORING PATTERN

This application claims the benefit of U.S. Provisional Patent Application No. 63/181,977, filed Apr. 30, 2021, which is incorporated by reference herein in its entirety.

BACKGROUND

The following relates to semiconductor integrated circuits (ICs) employing a fin field-effect transistor (finFET) or other three-dimensional (3D) transistor, and to the manufacturing thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
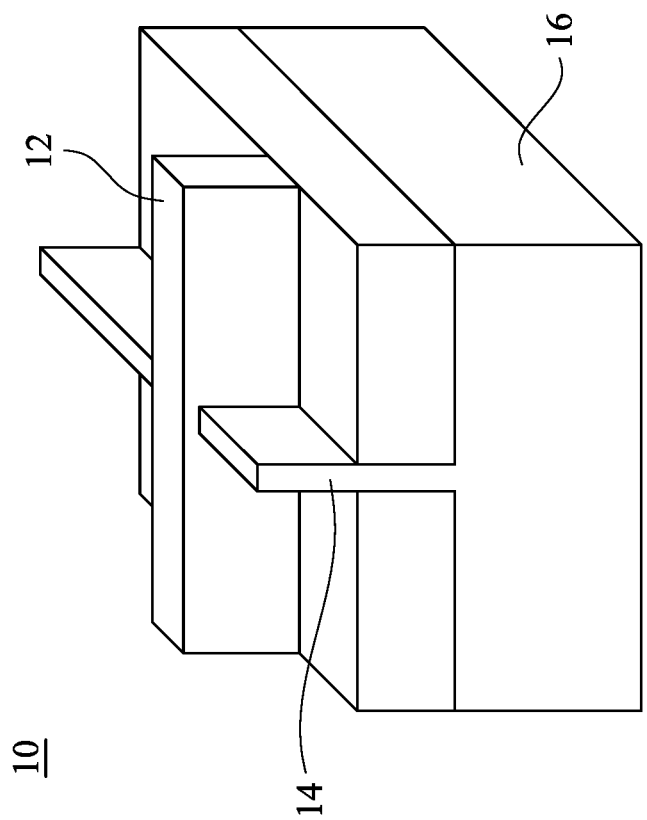
FIG. 1 diagrammatically illustrates a perspective view of a finFET employed in some exemplary embodiments disclosed herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, some embodiments disclosed herein relate to semiconductor devices employing and/or formed with one or more fin field-effect transistors (finFETs) therein. A finFET is referred to by this name because a channel between the source and drain regions of the field-effect transistor (FET) generally takes the form of a three-dimensional (3D) vertical wall or "fin" built on and/or rising from the semiconductor wafer. Accordingly, the finFET is a type of 3D transistor. The fin serves as the transistor channel, and the gate generally contacts the top and sides of the fin. Typically, finFET devices have significantly faster switching times and higher current density compared to planar transistor devices.

In some embodiments, a semiconductor wafer includes a device region in which an integrated circuit (IC) comprising one or more transistors and/or other semiconductor devices and/or the like are formed. In some embodiments, the device region and/or IC suitably incorporates one or more 3D transistors, such as illustrative finFETs, therein. With reference to FIG. 1, in practice, each finFET 10 is a multi-gate device where a metal (or other suitable material or material stack) gate 12 of the finFET wraps around and/or over one or more silicon (or other suitable material) walls or fins 14 extending vertically from a silicon (or other suitable material) substrate 16. The fin 14 acts as a selective conduction channel between a source and a drain of the finFET 10. While FIG. 1 shows the finFET 10 with a single fin 14 forming a source-drain channel, in some designs a set of mutually parallel fins form the source-drain channel. In practice, one or more oxide, high-k dielectric, insulating and/or other like suitable material layers (not labeled) are formed and/or employed to space and/or separate the gate 12 from the substrate 16 and/or fin 14. While the finFET 10 is employed in the illustrative examples, more generally another type of 3D transistor could be substituted for the finFET 10, such as a Gate-All-Around (GAA) FET.

In some embodiments, the device region is surrounded or encompassed by a seal ring region including one or more seal rings that each surround and/or encompass the device region. For example, the one or more seal rings includes a first inner seal ring and a second outer seal ring. In some embodiments, the inner seal ring is proximate and/or nearer to the device region than the outer seal ring, and the outer seal ring suitably surrounds and/or encompasses the inner seal ring.

In some embodiments, each seal ring includes a plurality of fins formed in and/or on the semiconductor wafer. Suitably, the seal ring fins are concentric and encompass or otherwise surround the device region. In practice, transistors, electronically functional and/or other like semiconductor devices are not formed in or on the seal rings or the fins thereof. Rather, the seal rings operate to protect the device region from moisture and/or other contamination, e.g., such as during subsequent processing of the wafer. Nevertheless, the seal ring fins may be formed of the same or similar material(s) and/or during the same manufacturing process step(s) and/or in a similar way as the fins for the electronically functional finFETs formed in the device region. For example, the seal rings may be formed together with the fins (or other 3D structures) of the finFETs (or other 3D transistors) of the IC in a single forming operation that employs lithographic patterning that defines both the fins of the FinFETs of the IC and rings of the seal rings. Due to the 3D nature of the seal rings which correspond to the 3D nature of the concurrently formed fins of the IC FinFETs, the seal rings rise from the semiconductor wafer to about the same height as the fins of the FinFETs of the IC. Consequently, the seal rings form a protective barrier against ingress of particles into the device region from the outside, such as may otherwise occur during dicing of the semiconductor wafer for example.

In some embodiments, a monitoring pattern is also formed on the semiconductor wafer. Suitably, the monitoring pattern is formed between the inner seal ring and the outer seal ring, and it likewise encompasses and/or surrounds the device region. In some embodiments, the monitoring pattern includes one or more fins. In practice, the monitoring pattern fins may encircle and encompass or surround the device region. The monitoring pattern fins may be formed of the same or similar material(s) and/or during the same manufacturing process step(s) and/or in a similar way as the fins for the electronically functional finFETs formed in the device region. For example, the monitoring pattern may be formed together with the fins of the finFETs of the IC in the single forming operation that employs lithographic patterning that defines both the fins of the FinFETs of the IC and rings of the seal rings and the monitoring pattern.

In some embodiments, one or more electronically functional finFETs are formed in a connecting region of the monitoring pattern. In some embodiments, the monitoring pattern fins in the connecting region of the monitoring pattern have a longitudinal orientation that is substantially the same as the majority of fins formed in the device region. In this context, longitudinal orientation refers to the direction corresponding to the element's lengthwise or longest dimension parallel with the surface of the semiconductor wafer.

Suitably, a monitoring pattern is created by forming an electrical contact which wraps around and/or over one or more of the fins formed in the monitoring pattern. In practice, a longitudinal orientation of the monitoring pattern electrical contact is substantially orthogonal to a longitudinal orientation of the monitoring pattern fins at the location of the monitoring pattern electrical contact. In this context, longitudinal orientation refers to the direction corresponding to the element's lengthwise or longest dimension parallel with the surface of the semiconductor wafer. Suitably, the longitudinal orientation of the monitoring pattern electrical contact aligns with and/or is parallel to the longitudinal orientation of finFET gates formed in the device region. In practice, the monitoring pattern electrical contact may be formed of the same or similar material(s) and/or during the same manufacturing process step(s) and/or in a similar way as the gates for the electronically functional finFETs formed in the device region.

In some embodiments, a pair of polycrystalline silicon dummy structures (individually referred to herein as a "dummy poly" structure) are also formed in the monitoring pattern on opposing sides of the monitoring pattern electrical contact, i.e., such that the monitoring pattern electrical contact is positioned or located in-between the pair of dummy poly structures. In some embodiments, the dummy poly structure comprises an electronically unused structure formed of a gate stack (optionally formed at the same time the gates of the finFETs are formed) having an outer skin of high-k polycrystalline silicon material. The dummy poly structures are suitably formed to wrap around and/or over one or more of the monitoring pattern fins in essentially the same or similar way as the electronically functional finFET gates of the finFETs in the device region. In some embodiments, a longitudinal orientation of each of the dummy poly structures of a given pair thereof is substantially parallel to a longitudinal orientation of the monitoring pattern electrical contact between the given pair. Suitably, the longitudinal orientation of the dummy poly structures aligns with and/or is parallel to the longitudinal orientation of finFET gates formed in the device region.

While a given pair of dummy poly structures do not generally serve an electronic function in the monitoring pattern, they can act to promote improved epitaxial growth of epitaxial material on the fin(s) of the monitoring pattern, i.e., an improved effective growth rate and/or size as compared to when dummy poly structures are not present. For example, when the epitaxial material is grown without the dummy poly structures present, epitaxial growth is generally only realized in one growth direction, e.g., from a top of the monitoring pattern fin upward. Conversely, when the epitaxial material is grown with the dummy poly structures present, epitaxial growth is generally realized in multiple (e.g., three) growth directions, e.g., from a top of the monitoring pattern fin upward, and laterally inward from each of the two dummy poly structures on either side of the finFET gate. This enables the epitaxial growth to be faster, thus producing a greater height of deposited epitaxial material. The epitaxial material may include, by way of nonlimiting illustrative example: a semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). In some embodiments, lattice constants of the epitaxial source/drain structures may be different from that of the monitoring pattern fins, so that the epitaxial material can be strained or stressed to improve carrier mobility and enhance the device performance.

Figure 2:
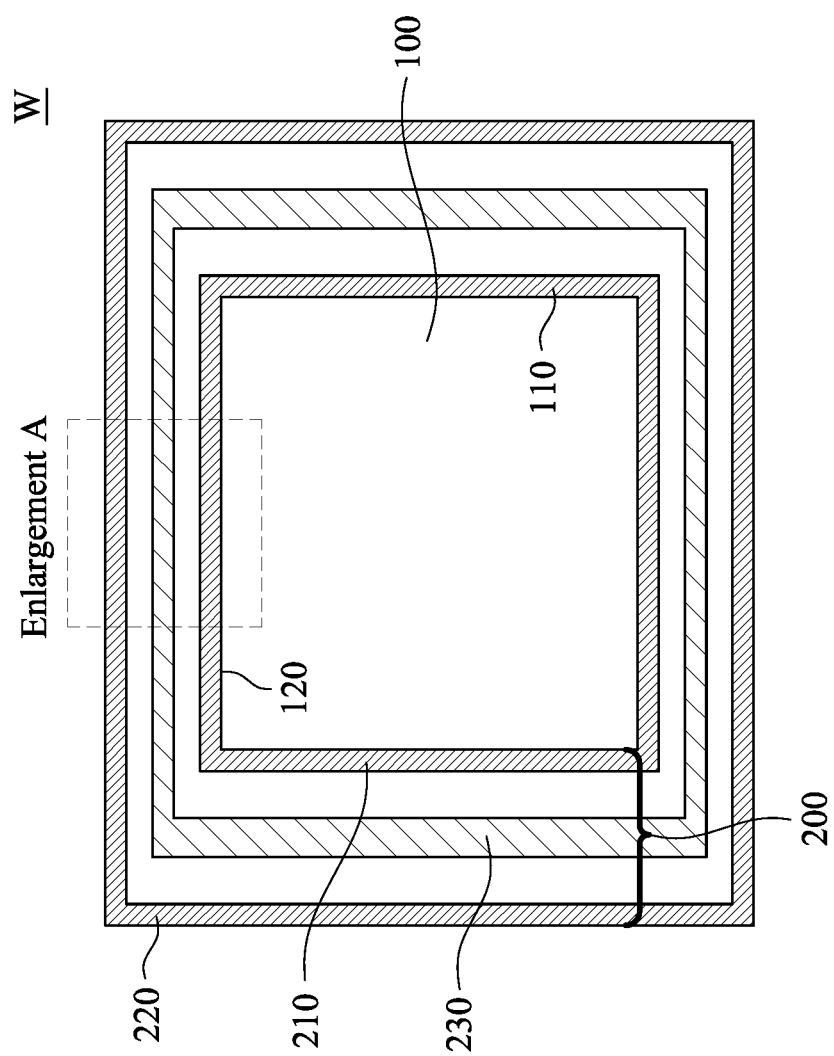
FIG. 2 diagrammatically illustrates a top view of a semiconductor structure and/or wafer with defined regions identified and/or established therein according to some exemplary embodiments disclosed herein.

With reference to FIG. 2, there is shown a top view of a semiconductor wafer W in accordance with some exemplary embodiments described herein. As shown, the wafer W includes a device region 100 and a seal ring region 200 which encompasses and/or surrounds the device region 100.

In practice, an integrated circuit (IC) comprising one or more transistors and/or other semiconductor devices and/or the like is formed in the device region 100. In some embodiments, the device region 100 and/or the IC formed therein suitably incorporates one or more finFETs (or other type of 3D transistor). In practice, each finFET is a multigate device where a gate of the finFET wraps around and/or over one or more silicon walls or fins (more generally, one or more 3D structures of the 3D transistor) acting as conduction channels between a source and a drain of the finFET or other type of 3D transistor. For example, the device region finFETs may be essentially as shown in FIG. 1, or may include a set of mutually parallel fins instead of the single fin 14 of the finFET 10 of FIG. 1). In some embodiments, a majority of the fins in the device region 100 have a common orientation and/or alignment in a given direction, which is referred to at times herein as the main fin direction within the device region 100. However, this is not required.

As shown in FIG. 2, the seal ring region 200 includes a first inner seal ring 210 and a second outer seal ring 220 which both surround and/or encompass the device region 100. As shown, the seal ring region 200 also includes a monitoring pattern 230 formed between the first inner seal ring 210 and the second outer seal ring 220. In some suitable embodiments, the spacing between the first inner seal ring 210 and the second outer seal ring 220 may be, for example, about 1.8 µm. As illustrated, the inner seal ring 210 is proximate and/or nearer to the device region 100 than the monitoring pattern 230 and the outer seal ring 220. Suitably, as shown, the monitoring pattern 230 surrounds and/or encompasses both in the inner seal ring 210 and the device region 100, and the outer seal ring 220 surrounds and/or encompasses the monitoring pattern 230, the inner seal ring 210 and the device region 100. While the illustrative monitoring pattern 230 encircles the device region 100, this is not necessary, and in some embodiments one or more separate monitoring patterns occupy the space between the outer and inner seal rings 220, 230.

Figure 3:
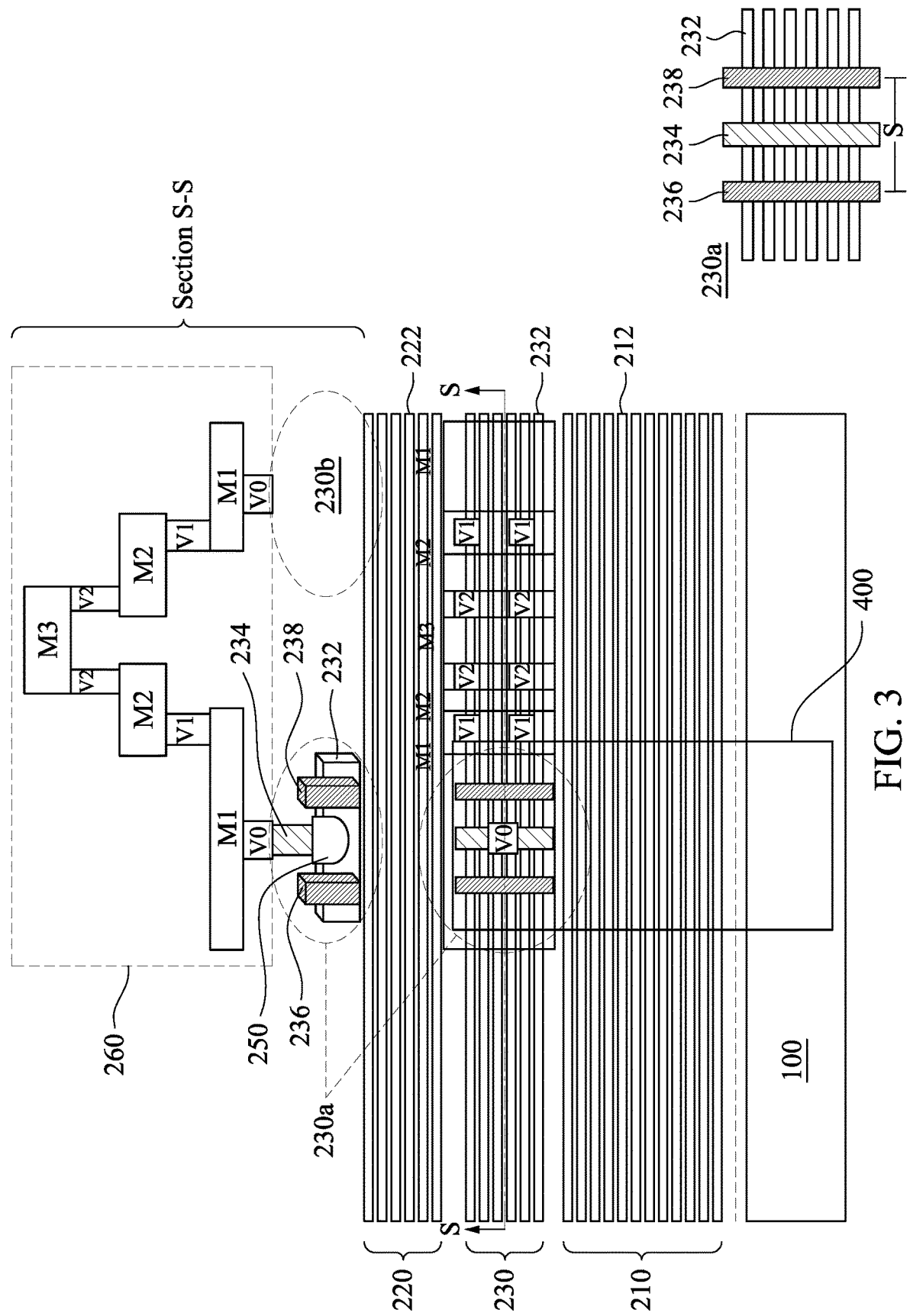
FIG. 3 diagrammatically illustrates a magnified or blown-up view of a selected portion (Enlargement A) of FIG. 2, e.g., including a connecting region of a monitoring pattern.

With added reference to and as shown in FIG. 3, in some embodiments, the inner seal ring 210 includes a plurality of seal ring fins 212 formed in and/or on the semiconductor wafer W, and the outer seal ring 220 likewise includes a plurality of seal ring fins 222 formed in and/or on the semiconductor wafer W. Suitably, the seal ring fins 212 and 222 in each of the respective seal rings 210 and 220 are concentric and encompass or otherwise surround the device region 100. In practice, transistors, electronically functional and/or other like semiconductor devices are not formed in or on the seal rings 210 and 220 or the fins 212 and 222 thereof. Rather, the seal rings 210 and 220 operate as physical barriers to protect the device region 100 from moisture and/or other contamination, e.g., such as during subsequent processing of the wafer. The seal ring fins 212 and 222 may be formed of the same or similar material(s) and/or during the same manufacturing process step(s) and/or in a similar way as the fins for the electronically functional finFETs formed in the device region 100. For example, during lithographic processing defining the fins 14 of the IC finFETs 10, the lithographic pattern can also define the seal rings 210 and 220 or some subset thereof, so that the seal rings 210 and 220 are formed together with the fins 14 of the IC finFETs 10.

In some embodiments, each of the seal ring fins 212 and 222 may form a closed loop that encircles the device region 100. In some embodiments, each seal ring fin 212 and 222 is formed along a path that runs essentially parallel to an edge of the device region 100 to which the path is proximate. That is to say, the device region 100 may have a first edge 110 extending in a first direction, and a second edge 120 extending in a second direction, where the second direction is orthogonal to (and/or otherwise substantially different from) the first direction. Accordingly, where the seal ring fins 212 and 222 follow a path alongside of the first edge 110 of the device region 100, they run substantially parallel to the first edge 110; and where the seal ring fins 212 and 222 follow a path alongside of the second edge 120 of the device region 100, they run substantially parallel to the second edge 120. While for illustrative purposes herein, the corners of the seal rings 210 and 220 are shown as being formed at 90 degree angles, in practice, in some embodiments, the corners may be rounded or cut.

In some embodiments, the monitoring pattern 230 includes a plurality of monitoring pattern fins 232 formed in and/or on the semiconductor wafer W. Suitably, the monitoring pattern fins 232 are concentric and encompass or otherwise surround the device region 100. In practice, the monitoring pattern fins 232 may be formed of the same or similar material(s) and/or during the same manufacturing process step(s) and/or in a similar way as the fins for the electronically functional finFETs formed in the device region 100. For example, during lithographic processing defining the fins 14 of the IC finFETs 10, the lithographic pattern can also define the monitoring pattern fins 232 or some subset thereof, so that the monitoring pattern fins 232 are formed together with the fins 14 of the IC finFETs 10 (and possibly also along with the seal ring fins 212 and 222 of the seal rings 210 and 220).

In some embodiments, each of the monitoring pattern fins 232 may form a closed loop that encompasses or surrounds the device region 100, although this is not necessary, and in other embodiments the fins may go only partway around the device region 100, e.g. each fin may be 1 mm in length in one nonlimiting illustrative example. In some embodiments, each monitoring pattern fin 232 is formed along a path that runs essentially parallel to an edge of the device region 100 to which the path is proximate. For example, where the monitoring pattern fins 232 follow a path alongside of the first edge 110 of the device region 100, they run substantially parallel to the first edge 110; and where the monitoring pattern fins 232 follow a path alongside of the second edge 120 of the device region 100, they run substantially parallel to the second edge 120. While for illustrative purposes herein, the corners of the monitoring pattern 230 are shown as being formed at 90 degree angles, in practice, in some embodiments, the corners may be rounded or cut.

As previously referenced, one or more connecting regions 230a are formed in the monitoring pattern 230. In some embodiments, a plurality of connecting regions 230a are spaced about monitoring pattern 230, for example, at about 1 mm intervals. FIG. 3 denotes the connecting region 230a by a superimposed circle, and an enlarged view of the illustrative connecting region 230a is shown in the lower right of FIG. 3. Suitably, the fins 232 in the connecting region 230a of the monitoring pattern 230 have a common orientation and/or alignment in a given direction which is substantially the same as the main fin direction within the device region 100. As shown in FIG. 3, the monitoring pattern connecting region includes an electrical contact 234 which contacts the fins 232 formed in the monitoring pattern 230. To facilitate this contact, epitaxial material is deposited onto the fins 232. In practice, a longitudinal orientation of the monitoring pattern electrical contact 234 is substantially orthogonal to a longitudinal orientation of the monitoring pattern fins 232 at the location of the monitoring pattern electrical contact 234. In this context, longitudinal orientation refers to the direction corresponding to the element's lengthwise or longest dimension in a direct parallel with the plane of the surface of the semiconductor wafer. Suitably, the longitudinal orientation of the monitoring pattern electrical contact 234 aligns with and/or is parallel to the longitudinal orientation of finFET gates formed in the device region 100.

More particularly, FIG. 3 shows a cross-sectional view designated Section S-S indicated in the plan-view drawing of FIG. 3. Section S-S depicts one of the fins 232 with epitaxial material 250 grown on the fin 232. The monitoring pattern electrical contact 234 is disposed on the epitaxial material 250. Section S-S further shows a proximate portion of the back end-of-line (BEOL) processing product 260 including metallization layers that provide electrical traces for interconnecting FinFETs and other circuit components formed in the device region 100. In IC design, the front end-of-line (FEOL) processing usually denotes formation of the FinFETs and other circuit devices, while the BEOL processing denotes the metallization stage. For a complex IC, there are often a fairly large number of metallization layers (e.g., 10 or more layers in some ICs) with vias providing interconnects between the metallization layers and/or between a metallization layer and a device formed during FEOL processing. An intermetal dielectric (IMD, not shown) provides the structural support for the metallization layers and vias. By way of nonlimiting illustration, diagrammatic Section S-S depicts three metallization layers M1, M2, M3 and three levels of vias designated V0, V1, V2. The fins 212, 222, 232 are formed during FEOL processing, usually concurrently with formation of fins of the FinFETs, e.g. by employing lithographically patterned deposition and etch processing that concurrently defines fins of the FinFETs of the device region 100 and the fins 212, 222 of the sealing rings and the fins 232 of the monitoring pattern. The BEOL processing employs deposition and lithographic patterning of successive metallization layers M1, M2, M3 to define electrical traces of the IC, and lithographically patterned formation of the vias of the via levels V0, V1, V2.

Notably, the "lowermost" vias of via level V0 electrically connect with contacts of the devices in the device region 100, and also as shown in Section S-S a via of the V0 via level contacts the monitoring pattern electrical contact 234 in the connecting region 230a of the monitoring pattern 230. While a single connecting region 230a is shown, more generally there may be one, two, three, four, or more (possibly hundreds) of similar connecting regions distributed in the area between the inner and outer sealing rings 210, 220. The electrical connection of the connecting region(s) 230a of the monitoring pattern 230 can serve a wide range of purposes. In one approach, a well region 400 is formed during FEOL processing, which electrically connects the connecting region 230a with the device region 100. In similar fashion, another connecting region 230b (generally indicated in Section S-S) may similarly be connected with the device region 100 by another well region (not shown). Circuitry in the device region 100 can be provided to form an electrical monitoring circuit including the portion of the fins 232 running between the two connecting regions 230a, 230b and the circuitry in the device region 100 connected by the well regions 400. Such a monitoring circuit can, for example, measure electrical continuity of the fins 232 running between the two connecting regions 232a, 232b so as to detect if dicing of the wafer introduced a deleterious crack or other damage passing between the connecting regions 232a, 232b. In one nonlimiting illustrative example, the spacing between the two connecting regions 232a, 232b is about 1 mm, and by daisy-chaining such 1 mm monitoring circuits around the device region 100 in the space between the inner and outer seal rings 210, 220 it is possible to detect any crack passing through the periphery of the device region 100 which produces an electrical short or open. Moreover, the location of such a crack can be localized with about 1 mm resolution based on which monitoring circuit(s) detect the electrical short or open. (It is noted that the 1 mm spacing of the monitoring circuits is merely a nonlimiting example, and more generally the spacing may be chosen based on the resistance per unit length of the fins 232 and other factors). The foregoing continuity test monitoring is merely an example, and it will be appreciated that numerous other types of conditions may be similarly monitored using the monitoring pattern 230.

Regardless of the type of monitoring circuit implemented, the connecting regions 232a, 232b connect the monitoring circuit to one or more of the metallization layers M1, M2, M3, . . . , which in turn may connect the monitoring circuit to circuitry inside the device region 100 to provide for an IC self-test based on the output of the monitoring circuit. In another approach, the connecting regions 232a, 232b may connect the monitoring circuit by way of the metallization layers M1, M2, M3, . . . to a topmost contact pad that can be contacted by a probe of an external testing device to enable the testing device to measure the output of the monitoring circuit in order to assess integrity of the IC.

With continuing reference to Section S-S, the connecting regions 230a, 230b, . . . should make low-resistance electrical contacts with the respective vias of the V0 via layer that connect those regions with the BEOL processing product 260. To this end, the electrical contact 234 and the underlying epitaxial material 250 should be of sufficient thickness (or "height" in the sectional view of Section S-S) so that they reach the V0 layer. However, the fin 232 is relatively thin, and the epitaxial growth occurs in a generally upward direction from the top of the fin 232. This can result in a low growth rate of the epitaxial material 250, which in turn can result in insufficient thickness of the epitaxial material 250 and consequently a high electrical resistance between the fin 232 and the connecting via of the V0 via layer. See also FIG. 6A.

As disclosed herein, the growth rate of the epitaxial material 250 can be increased by forming a pair of dummy polycrystalline silicon (poly) structures 236 and 238 on opposite sides of the region of the fin 232 where the epitaxial material 250 and electrical contact 234 are to be formed. Advantageously, the dummy poly structures 236 and 238 can be formed concurrently with formation of polycrystalline silicon gate structures of FinFETs of the device region 100, e.g. by employing lithographically patterned deposition and etch processing that concurrently defines the functional polycrystalline silicon gate structures of the FinFETs and the dummy poly structures 236 and 238. By placing the dummy poly structures 236 and 238 sufficiently close to the region where the epitaxial material 250 is to be grown, as disclosed herein the dummy poly structures 236 and 238 promote epitaxial growth in three directions: upward (as in the case without the dummy poly structures 236 and 238), and also inward from each of the two dummy poly structures 236 and 238. This provides for a larger thickness of the epitaxial material 250 and consequently improved electrical contact with the connecting via of the V0 via layer.

As shown in FIG. 3, in some embodiments, a pair of dummy poly structures 236 and 238 are also formed at the connecting region 230a in the monitoring pattern 230 on opposing sides of the monitoring pattern electrical contact 234, i.e., such that the monitoring pattern electrical contact 234 is positioned or located in-between the pair of dummy poly structures 236 and 238. In some embodiments, the dummy poly structures 236 and 238 are essentially electronically unused structures formed of a gate stack having an outer skin of high-k polycrystalline silicon material. As such, in some embodiments the dummy poly structures 236 and 238 may be formed, at least in part, during formation of the gates of the finFETs 10 of the device region 100. The dummy poly structures 236 and 238 are suitably formed to wrap around and/or over one or more of the monitoring pattern fins 232 in essentially the same or similar way as the electronically functional gate 12 of the finFET 10. In some embodiments, a longitudinal orientation of each of the dummy poly structures 236 and 238 is substantially parallel to a longitudinal orientation of the monitoring pattern electrical contact 234 which is disposed between the dummy poly structures 236 and 238. Suitably, the longitudinal orientations of the dummy poly structures 236 and 238 align with and/or are parallel to the longitudinal orientations of finFET gates formed in the device region 100.

For the dummy polymer structures 236 and 238 to provide acceleration of the epitaxial growth rate, a spacing S between the dummy poly structures 236 and 238 should be small enough so that the inward epitaxy from the dummy poly structures 236 and 238 can cooperate with the epitaxial growth upward from the fin 232. This imposes a maximum value for the spacing S between the dummy poly structures 236 and 238. In some embodiments, for example where the semiconductor device has a 16 nm node and/or feature size, the spacing S between the dummy poly structures 236 and 238 is no greater than 0.2 microns, and in some embodiments about 0.118 In other embodiments, where semiconductor devices have larger or smaller node and/or feature sizes, the spacing S may vary accordingly, and the maximum spacing for providing enhanced epitaxial growth rate can be readily determined empirically for a given node size. In any event, a suitably close spacing S helps ensure that the epitaxial growth between the dummy polymer structures 236 and 238 can be effectively enhanced and/or aided as desired by the dummy poly structures 236 and 238.

Figure 4:
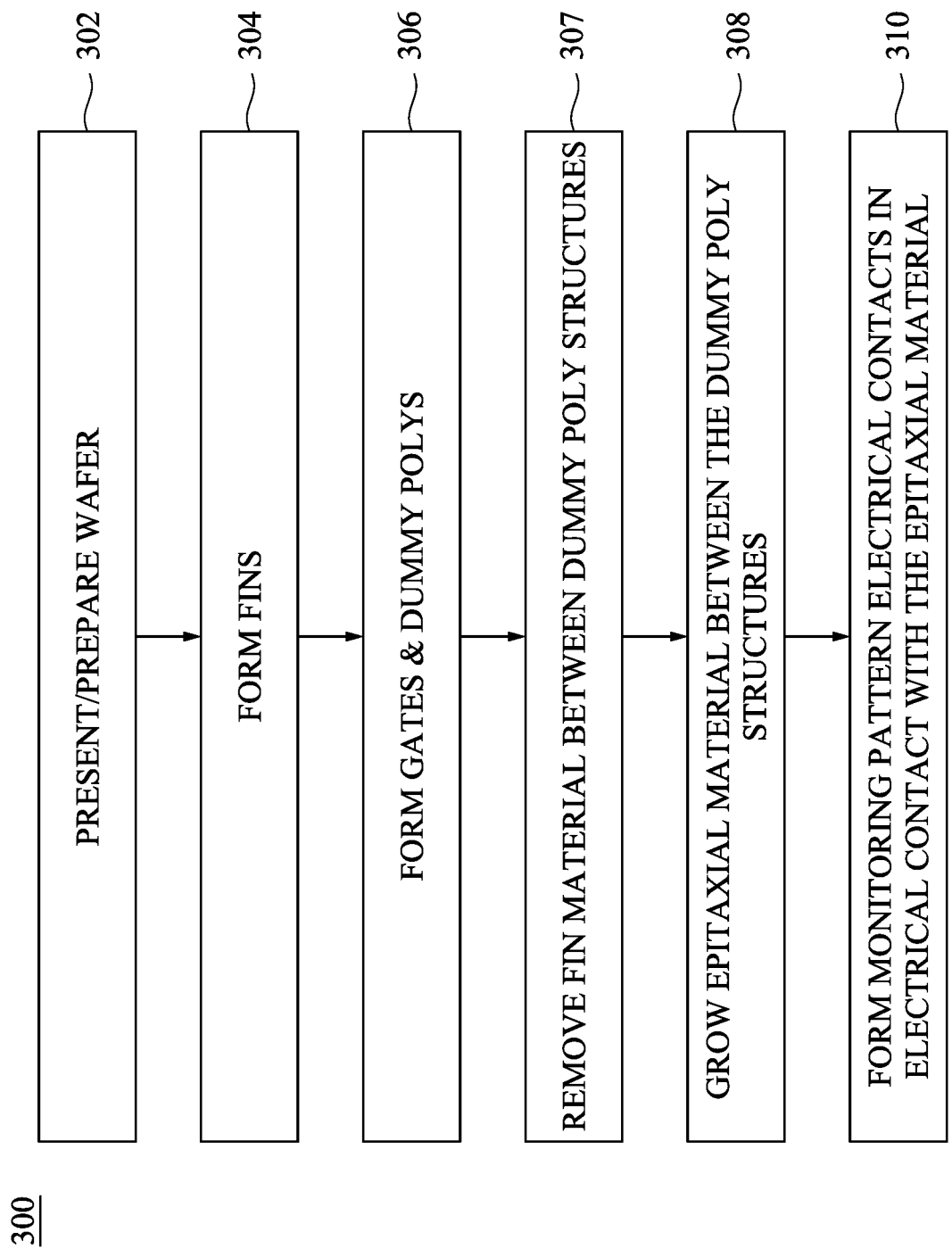
FIG. 4 shows a flow chart illustrating a semiconductor device manufacturing process in accordance with some embodiments described herein.

With added reference now to FIG. 4, there is shown an example process 300 employed for the manufacture of a semiconductor device in accordance with some embodiments described herein. It is to be understood that the process of FIG. 4 is simplified and that additional steps not shown in FIG. 4 may be used in the manufacturing process.

As shown, in process step 302, the semiconductor wafer W is presented and suitably prepared for subsequent processing. This may involve, for example, wafer cleaning, deposition of one or more epitaxial layers, and/or the like.

At process step 304, fins are formed in and/or on the prepared semiconductor wafer W. Suitably, the fins for the finFETs in the device region 100, the seal ring fins 212 and 222, and the monitoring pattern fins 232 may all be formed, in practice, during the same processing step 304, including one or more of photolithography, masking, layer and/or material deposition, etching and/or other like semiconductor structure forming sub-steps. In some embodiments, the fins 232 are formed the connecting region 230a of the monitoring pattern 230 so as to have a common orientation that is substantially the same as the main direction of the fins formed in the device region 100.

At process step 306, the gates 12 of the finFETs 10 in the device region 100 are formed, which wrap around and/or over one or more established fins to define finFETs at designated locations and dummy poly structures are formed which wrap around and/or over one or more established fins at designated locations. Suitably, the dummy poly structures 236 and 238 may all be formed, in practice, during the same processing step 306, including one or more of photolithography, masking, layer and/or material deposition, etching and/or other like semiconductor structure forming sub-steps. In some embodiments, the dummy poly structures 236 and 238 are formed so as to have a common orientation that is substantially the same as an orientation of a majority of the finFET gates formed in the device region 100.

At process step 307, a suitable etching or other like material removal process is performed to selectively remove a portion of the fins 232 between the dummy poly structures 236 and 238, thereby exposing vertically extending lateral fin side walls 232a and fin floors 232b (see, for example, FIG. 5B) from which epitaxial growth of the epitaxial material 250 can subsequently proceed. In some suitable embodiments, during the aforementioned etching and/or material removal process, that portion of the fins 232 residing under and/or covered by the dummy poly structures 236 and 238 are protected from this etching or material removal process and hence not removed. Accordingly, the vertically extending lateral fin side walls 232a which are exposed extend substantially up to the original fin height, while the exposed fin floors 232b are established at some distance below or otherwise set back from the original fin height, while still being raised with respect to the wafer substrate. While only one is shown in FIG. 5B, it is to be appreciated that a pair of exposed vertically extending lateral fin side walls 232a are thus established by the pair of dummy ploy structures 236 and 238 at either end of an exposed fin floor 232b. Hence, as shown in FIG. 5B, epitaxial growth of the epitaxial material 250 is achieved in three directions, namely, laterally inward (as indicated by the arrows 242) from each of the two exposed and/or established vertically extending lateral fin side walls 232a, and vertically upward (as indicated by the arrow 240) from the top of the exposed and/or established fin floor 232b.

Returning attention to FIG. 4, at process step 308, epitaxial material is epitaxially grown on the fins 232 of the monitoring pattern 230. In some embodiments, the epitaxial growth of the epitaxial material is achieved in multiple growth directions, e.g., three growth directions, namely, from a top of the fin 232 upward and laterally inward from each of the pair of dummy poly structures 236 and 238. Suitably, in some embodiments, epitaxial material of the source and/or drain structures for the finFETs in the device region 100, and the epitaxial material grown on the fins 232 of the monitoring pattern 230 may both be epitaxially grown during the same processing step 308.

At process step 310, the electrical contact or contacts 234 of the monitoring pattern connecting region 230a are formed in contact with the epitaxial material grown on the fins 232 of the monitoring pattern 230. Because the pair of dummy poly structures 236 and 238 increase the growth rate of the epitaxial growth of the epitaxial material between the dummy poly structures 236 and 238, the epitaxial material is grown to a higher height and is more easily contacted by the electrical contact 234 formed in the process step 310. In some embodiments, the electrical contact or contacts 234 of the monitoring pattern connecting region 230a are formed along with the electrical contacts to the source and drain regions of the finFETs 10 during the same processing step 310.

Optionally, in some suitable embodiments, at some point after the epitaxial growth step 308 has been completed, the one or more dummy poly structures 236 and 238 may be removed partially or in whole, for example, by a suitable etching or other material removal process and/or step. In some embodiments, a metal (or other material) gate may optionally be subsequently deposited and/or otherwise formed in place of the removed dummy poly structure. For example, a side wall spacer may be formed along the poly material, the poly material may be removed, and metal gate material may be deposited in place of the removed poly material. In practice, the dummy poly structures are not replaced in this manner until after the dummy poly structures 236 and 238 have served their purpose to promote the epitaxial growth of the epitaxial material as described therein.

Figure 5C:
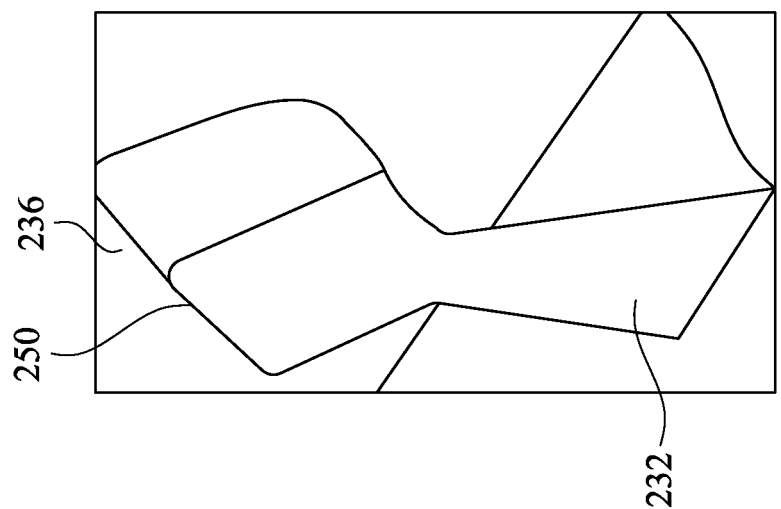
FIGS. 5A, 5B, and 5C diagrammatically illustrate a difference between the effective epitaxial growth directions of source and/or drain structures without the presence of dummy poly structures (FIG. 5A) and with the presence of dummy poly structures (FIGS. 5B and 5C) as described herein.
Figure 5B:
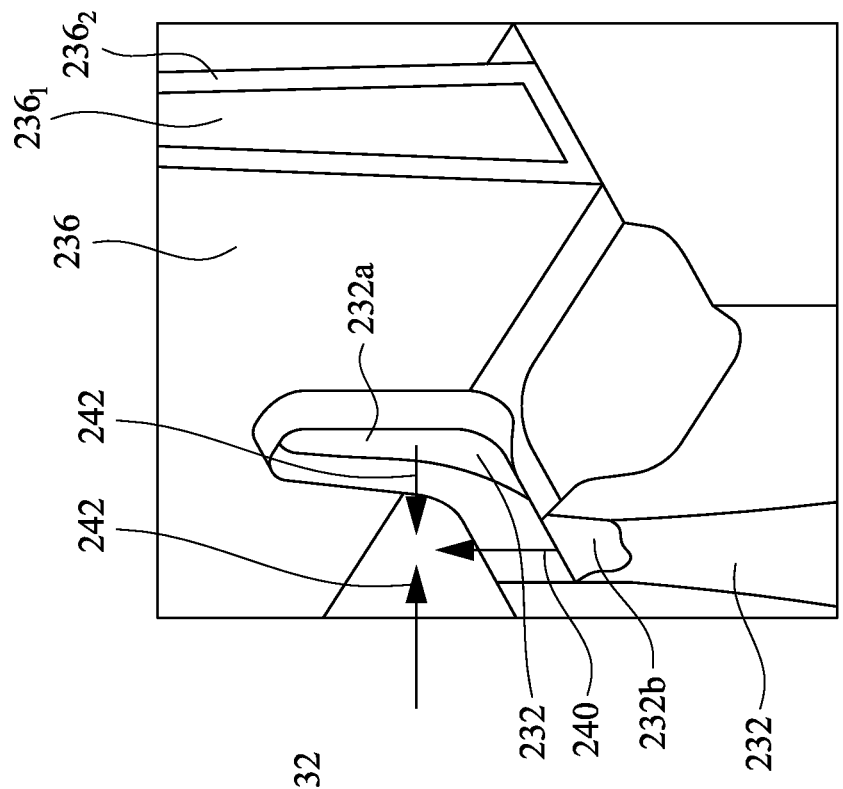
Figure 5A:
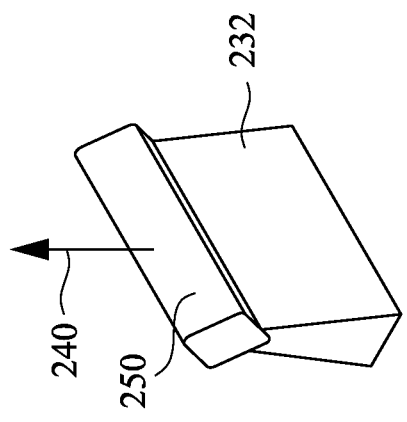

With reference to FIGS. 5A, 5B, and 5C, a difference between the effective epitaxial growth directions of epitaxial material in the process step 308 with and without the presence of the dummy poly structures 236 and 238 is illustrated. With particular reference to FIG. 5B, in some embodiments the dummy poly structures 236 (shown, and likewise for dummy poly structure 238) comprise a gate stack 2361 having an outer skin 2362 of high-k polycrystalline silicon material. As shown in FIG. 5A, when dummy poly structures are not present, the epitaxial growth of epitaxial material 250 on the fin 232 of the monitoring region 230 is generally realized effectively in only one direction, namely, from a top of the fin 232 upward, as indicated in FIG. 5A by an arrow 240 representing the upward growth direction. In contrast, as shown in FIGS. 5B and 5C, when dummy poly structures 236 and/or 238 are present, the epitaxial growth of the epitaxial material 250 is generally realized effectively in multiple growth directions, e.g., from a top of the fin 232 upward, as indicated by the arrow 240 representing the upward growth direction, and laterally inward from a side of the poly structure 236, as indicated by arrows 242 representing the lateral inward growth direction indicated in FIG. 5B. For simplicity and/or clarity herein, only one dummy poly structure 236 of the pair of dummy poly structures 236 and 238 is shown in FIGS. 5B and 5C. However, in accordance with some embodiments, both of the pair of dummy poly structures 236 and 238 are present in practice, and hence lateral inward epitaxially growth of the source and/or drain structures is similarly realized from the sides of each of the dummy poly structures 236 and 238. FIG. 5C diagrammatically illustrates the resulting epitaxial material 250 prior to commencement of the process step 310 in which the electrical contact 234 is formed. As previously mentioned, for the inward epitaxial growth 242 to combine with the upward epitaxial growth 240 to accelerate the overall upward epitaxial growth rate, the spacing S between the dummy poly structures 236 and 238 (see FIG. 3) should be sufficiently small, e.g. no greater than 0.2 microns in some embodiments, and in some embodiments about 0.118 μm.

In some embodiments, it is to be appreciated that the fins 232 of the monitoring pattern 230 may initially be formed to have a substantially uniform vertical height like the fin 14 shown in FIG. 1, having been suitably formed in a similar fashion and/or substantially concurrently therewith. However, as shown in FIG. 5B, for example, an etching process or other like material removal process is and/or has been performed to remove a selected potion of the fin 232 and expose a vertically extending lateral fin side wall 232a and a fin floor 232b from which epitaxial growth of the epitaxial material 250 can subsequently proceed. Notably, however, during the aforementioned etching and/or material removal process, that portion of the fin 232 residing under and/or covered by the dummy poly structures 236 and 238 is protected from this etching or material removal process and hence not removed. Accordingly, the vertically extending lateral fin side wall 232a is exposed which extends substantially up to the original fin height, and the exposed fin floor 232b is established at some distance below or otherwise set back from the original fin height, while still being raised with respect to the wafer substrate. While only one is shown in FIG. 5B, it is to be appreciated that a pair of exposed vertically extending lateral fin side walls 232a are thus established by the pair of dummy ploy structures 236 and 238 at either end of the exposed fin floor 232b. Hence, as shown in FIG. 5B, epitaxial growth of the epitaxial material 250 is achieved in three directions, namely, laterally inward (as indicated by the arrows 242) from each of the two exposed and/or established vertically extending lateral fin side walls 232a, and vertically upward (as indicated by the arrow 240) from the top of the exposed and/or established fin floor 232b.

Figure 6B:
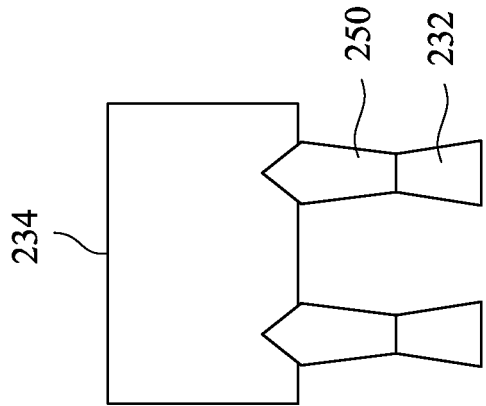
FIGS. 6A and 6B diagrammatically illustrate a potential resulting difference in epitaxial grown source and/or drain structures grown with and without the presence of dummy poly structures as described herein.
Figure 6A:
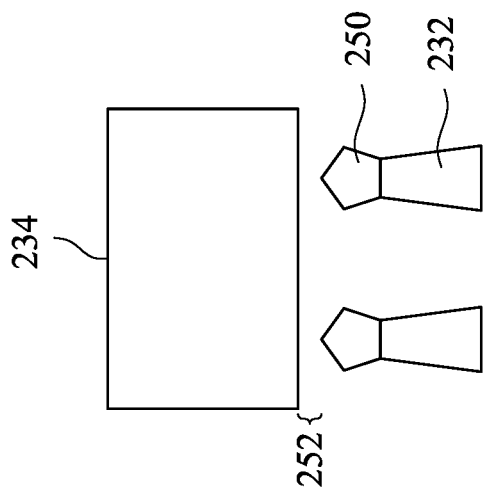

With reference to FIGS. 6A and 6B, a potential resulting difference in epitaxial material 250 being grown with and without the presence of the dummy poly structures 236 and 238 is illustrated. As shown in FIG. 6A, when dummy poly structures are not present during the epitaxial growth of the epitaxial material 250, the epitaxial material 250 atop the fins 232 run the risk of not being sufficiently large or tall enough (i.e. of insufficient height) to effectively make good electrical contact with the electrical contact 234 formed in the process step 310 of FIG. 4, e.g., due to the limited epitaxially growth direction experienced and/or achieved without the presence of the dummy poly structures. Accordingly, there may be a partial or complete gap 252 between the epitaxial material 250 and the subsequently formed electrical contact 234, which increases electrical resistance of the electrical contact 234 or causes it to fail to make electrical contact entirely. In contrast, as shown in FIG. 6B, when the dummy poly structures 236 and/or 238 are present during the epitaxial growth of the epitaxial material 250, the epitaxial material 250 atop the fins 232 can more readily, quickly, efficiently and/or easily be effectively grown sufficiently large or tall enough (i.e. to sufficient height) to effectively make good contact with the electrical contact 234 formed in the process step 310 of FIG. 4. The higher effective epitaxial growth rate is due to the multiple epitaxially growth directions 240, 242 (see FIG. 5B) experienced and/or achieved with the presence of the dummy poly structures 236 and 238. Accordingly, the epitaxial material 250 is less apt to experience an effective and/or partial electrical open with respect to the electrical contact 234 formed in the process step 310 due to insufficient epitaxial growth.

Figure 7:
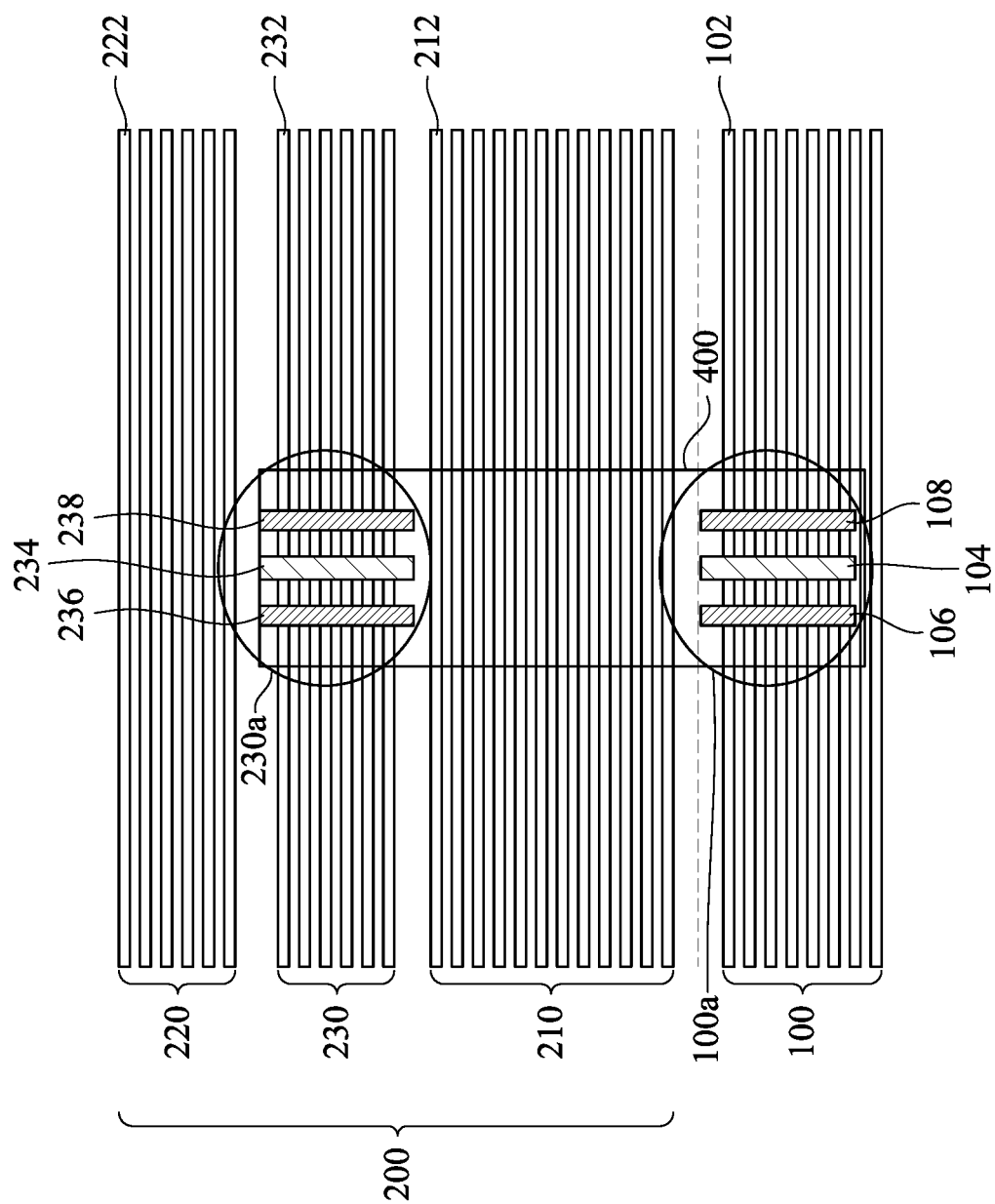
FIG. 7 diagrammatically illustrates a magnified or blow-up partial top view of a semiconductor structure and/or wafer with defined regions identified and/or established therein according to some exemplary embodiments disclosed herein.

With reference to FIG. 7, there is shown a partial top view of a semiconductor device in accordance with yet some further embodiments. As shown in FIG. 7, a well region 400 is formed in the semiconductor wafer W. The well region 300 provides for an electrical connection and/or communication between the connecting region 230a in the monitoring pattern 230 and selected circuitry formed in a connecting region 100a of the device region 100. The well region 400 may in practice include a quantum well or potential well and/or one or more quantum wires or the like.

In some embodiments, one or more fins 102 and one or more electronically electrical contacts 104 to those fins 102 are formed in the connecting region 100a of the device region 100. For example, the device region finFETs may be essentially as shown in FIG. 1. Suitably, the device region fins 102 in the connecting region 100a of the device region 100 have a common orientation and/or alignment in a given direction which is substantially the same as the main fin direction within the device region 100. Moreover, the device region fins 102 in the connecting region 100a of the device region 100 and the monitoring pattern fins 232 in the connecting region 230a of the monitoring pattern 230 may in practice have the same or substantially the same orientation and/or alignment as one another, i.e., they run in substantially parallel directions.

In some embodiments, one or more electrical contacts 104 are formed in the connecting region 100a of the device region 100. As shown, in accordance with some embodiments, the device region electrical contact 104 has a longitudinal orientation that is substantially orthogonal to a longitudinal orientation of the device region fins 102 at the location of the device region electrical contact 104. In this context, longitudinal orientation refers to the direction corresponding to the element's lengthwise or longest dimension. Suitably, the longitudinal orientation of the device region electrical contact 104 aligns with and/or is substantially parallel to the longitudinal orientation of electrical contact 234 formed in the connecting region 230a of the monitoring pattern 230. In practice, the device region electrical contact 104 and the monitoring pattern electrical contact 234 may be formed of the same or similar material(s) and/or during the same manufacturing process step(s) and/or in a similar way.

As shown in FIG. 7, a pair of dummy poly structures 106 and 108 are also formed at the connecting region 100a in the device region 100 on opposing sides of the device region electrical contact 104, i.e., such that the device region electrical contact 104 is positioned or located in-between the pair of dummy poly structures 106 and 108. These operate to increase the growth rate of epitaxial material that is epitaxially grown on the device region fins 102 so as to increase the height of the epitaxial material and promote good electrical contact with the subsequently formed electrical contact 104, in the same manner already described for the epitaxial material 250 in the case of the monitoring pattern (e.g., see FIGS. 5B and 5C). In some embodiments, the dummy poly structures 106 and 108 are again essentially electronically unused structures formed of a gate stack having an outer skin of high-k polycrystalline silicon material. The dummy poly structures 106 and 108 are suitably formed to wrap around and/or over one or more of the device region fins 102 in essentially the same or similar way as the electronically functional device region finFET gate 12 of the finFETs 10 of the device region 100. In some embodiments, a longitudinal orientation of each of the dummy poly structures 106 and 108 is substantially parallel to a longitudinal orientation of the device region electrical contact 104 in-between the pair of dummy poly structures 106 and 108. Suitably, the longitudinal orientations of the dummy poly structures 106 and 108 align with and/or are substantially parallel to the longitudinal orientations of the dummy poly structures 236 and 238.

In some embodiments, for example where the semiconductor device has a 16 nm node and/or feature size, a spacing between the dummy poly structures 106 and 108 is no greater than 0.2 microns, and in some embodiments about 0.118 In other embodiments, where semiconductor devices have larger or smaller node and/or feature sizes, the spacing may vary accordingly. In any event, a suitably close spacing helps ensure that the epitaxial growth of material on the fins 102 between the dummy poly structures 236 and 238 in the connecting region 100a of the device region 100 can be effectively enhanced and/or aided as desired by the dummy poly structures 106 and 108.

In some embodiments, the monitoring pattern connecting region 230a of the monitoring pattern 230 is electrically connected and/or otherwise in communication, via the well region 400, with the device region connecting region 100a of the device region 100. Accordingly, by suitable probing of the connecting region 230a in the monitoring pattern 230, selected circuitry within the device region 100 can be accessed (e.g., via the connecting region 100a of the device region 100). In this way, suitable process monitoring, testing and/or analysis (e.g., in accordance with the selected circuitry) may be performed on the semiconductor W and/or device and/or the IC formed in the device region 100, without having to probe the device region 100 directly.

It is to be appreciated that, in some embodiments, the monitoring pattern 230 as disclosed herein may be used to conduct circuit or contact probe (CP) testing (e.g., on a wafer basis) and/or final testing (FT) (e.g., on a die basis). CP testing is performed using a wafer probe, and may for example entail applying input signals via the probe and measuring response signals via the same or a different probe. Final testing is performed after dicing the wafer to separate individual diced chips, and a chip serving as a device-under-test (DUT) is placed on a probing machine and probes used to electrically contact selected contact pads (or metal bumps, solder balls, or so forth). One benefit or advantage realized by some embodiments disclosed herein is the ability to detect, for example, die level defect which may be caused during assembly processes like die sawing or packaging which can cause the die crack or delamination; and while a failure rate of this type may not be relatively high, it still represents a not insignificant level, e.g., of defective parts per million (dppm), which is undesirable for quality concern. Moreover, in practice, the plurality and spacing intervals of the connecting regions 230a and 230b in the monitoring pattern 230 as disclosed herein allows continuity testing over a relatively larger coverage area and/or with relatively greater resolution, for example, as compared to conventional CP functional tests like scan/chain. Notably, this improved resolution permits the detection and/or localization of relatively small defects.

In some suitable embodiments, a comparator or other like testing circuit may be formed in the IC or device region 100 and connected with the electrical contact. Accordingly, in practice, the detecting of defects in the monitoring pattern 230 can be achieved by electrically connecting the connecting regions 230a and 230b to the comparator or testing circuit in the device region 100, e.g., via well regions 400. The comparator and/or testing circuit in the device region 100 can then be used to detect defects and/or continuity interruptions in the monitoring region 230 between the connected connecting regions 230a and 230b; and may, for example, be used to amplify a received signal and/or compare a received signal to a reference voltage or reference resistance.

Some further nonlimiting illustrative embodiments are described textually in the following.

In some embodiments disclosed herein, a method of manufacturing an IC is described. The method includes: forming, in a device region of the semiconductor wafer, one or more device region finFETs, each device region finFET including one or more device region fins formed to rise from the semiconductor wafer and a device region gate formed to wrap around one or more of said one or more device region fins; forming, in a seal ring region of the semiconductor wafer encircling the device region, an inner seal ring encircling the device region and an outer seal ring encircling both the inner seal ring and the device region; forming in the seal ring region a monitoring pattern disposed between the inner seal ring and the outer seal ring, said monitoring pattern including one or more monitoring pattern fins formed to rise from the semiconductor wafer; forming a first dummy polysilicon structure and a second dummy polysilicon structure in a connecting region of said monitoring pattern, each of said first and second dummy polysilicon structures being formed to wrap around one or more of said one or more monitoring pattern fins; epitaxially growing an epitaxial material on the one or more monitoring pattern fins between the first and second polysilicon structures; and forming an electrical contact between the first and second dummy polysilicon structures that electrically contacts the epitaxial material. In some embodiments the epitaxial material is epitaxially grown in multiple growth directions, including a first direction which is upward from a top of the monitoring pattern fins, and second and third directions which are laterally inward from the first and second dummy polysilicon structures, respectively.

In some embodiments disclosed herein, an IC includes: a device region including at least one device region 3D transistor including one or more 3D structures and a device region gate contacting the one or more 3D structures; a seal ring region encircling the device region, said seal ring region including at least one seal ring; and a monitoring pattern disposed in the seal ring region. The at least one seal ring comprises a set of seal ring 3D structures. The monitoring pattern comprises a set of monitoring pattern 3D structures and a connecting region including first and second polysilicon structures wrapped around the set of monitoring pattern 3D structures and an electrical contact disposed between the first and second polysilicon structures. The IC may further include epitaxial material interposed between the electrical contact and the set of monitoring pattern 3D structures. In some embodiments, the epitaxial material contacts all of the first polysilicon structure, the second polysilicon structure, the monitoring pattern 3D structures, and the electrical contact. In some embodiments the at least one device region 3D transistor is a FinFET and the 3D structures are fins.

In some embodiments disclosed herein, a method of manufacturing an IC includes: forming, in a device region of the semiconductor wafer, fins of finFETs of the IC; forming, in a seal ring region surrounding the device region, at least one seal ring comprising fins encircling the device region and a monitoring pattern comprising fins encircling the device region; forming, in the device region, gates of the finFETs of the IC; forming polysilicon structures on the fins of the monitoring pattern in a connecting region of the monitoring pattern; epitaxially growing an epitaxial material on the fins of the monitoring pattern between the polysilicon structures; and forming at least one electrical contact that electrically contacts the epitaxial material. In some embodiments, the epitaxial material is grown on the fins of the monitoring pattern between the polysilicon structures by a combination of epitaxial growth upward from the fins and epitaxial growth inward from the polysilicon structures. In some embodiments, the fins of the finFETs, the fins of the at least one seal ring, and the fins of the monitoring pattern are formed concurrently. In some embodiments, the gates of the finFETs and the polysilicon structures are formed concurrently.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an integrated circuit (IC), the method comprising:

forming, in a device region of the semiconductor wafer, one or more device region fin field-effect transistors (finFETs), each device region finFET including one or more device region fins formed to rise from the semiconductor wafer and a device region gate formed to wrap around one or more of said one or more device region fins;

forming, in a seal ring region of the semiconductor wafer encircling the device region, an inner seal ring encircling the device region and an outer seal ring encircling both the inner seal ring and the device region;

forming in the seal ring region a monitoring pattern disposed between the inner seal ring and the outer seal ring, said monitoring pattern including one or more monitoring pattern fins formed to rise from the semiconductor wafer;

forming a first dummy polysilicon structure and a second dummy polysilicon structure in a connecting region of said monitoring pattern, each of said first and second dummy polysilicon structures being formed to wrap around one or more of said one or more monitoring pattern fins;

epitaxially growing an epitaxial material on the one or more monitoring pattern fins between the first and second polysilicon structures; and forming an electrical contact between the first and second dummy polysilicon structures that electrically contacts the epitaxial material.

2. The method of claim 1, wherein the forming of the first and second dummy polysilicon structures is performed in a same process step that forms the device region gates of the finFETs.

3. The method of claim 1, further comprising:

removing a portion of at least one of the monitoring pattern fins between said first and second dummy polysilicon structures so as to: establish a first fin surface which is set back from a height of the fin remaining under the first and second dummy polysilicon structures; and expose a pair of fin side walls extending from the first fin surface to the height of the fin remaining under the first and second dummy polysilicon structures;

wherein during the epitaxially growing step, the epitaxial material is epitaxially grown in multiple growth directions, including a first direction which is upward from the first fin surface, and second and third directions which are laterally inward from the pair of fin side walls.

4. The method of claim 1, wherein a spacing between the first and second dummy polysilicon structures is no more than 0.2 micron.

5. The method of claim 1, wherein the monitoring pattern fins at the connecting region are aligned parallel to the device region fins.

6. The method of claim 1, wherein the electrical contact and the first and second dummy polysilicon structures are formed orthogonal to the monitoring pattern fins in the connecting region.

7. The method of claim 1, wherein the electrical contact and the first and second dummy polysilicon structures are aligned parallel to the device region gates.

8. The method of claim 1, further comprising:

forming a well region in the semiconductor wafer which provides an electrical connection between the connecting region in the monitoring pattern and circuitry formed in the device region.

9. The method of claim 1 wherein the one or more device region fins and the monitoring pattern fins are formed in a single forming operation.

10. A method of manufacturing an integrated circuit (IC), the method comprising:
    forming a device region including at least one device region three-dimensional (3D) transistor including one or more 3D structures and a device region gate contacting the one or more 3D structures;
    forming a seal ring region encircling the device region, said seal ring region including at least one seal ring; and
    forming a monitoring pattern disposed in the seal ring region;
    wherein the at least one seal ring comprises a set of seal ring 3D structures; and
    wherein the monitoring pattern comprises a set of monitoring pattern 3D structures and a connecting region including first and second polysilicon structures wrapped around the set of monitoring pattern 3D structures and an electrical contact disposed between the first and second polysilicon structures.

11. The method of claim 10, wherein each one or the set of monitoring pattern 3D structures forms a closed loop around the device region.

12. The method of claim 10, wherein epitaxial material is interposed between the electrical contact and the set of monitoring pattern 3D structures.

13. The method of claim 12, wherein:
    the epitaxial material contacts all of the first polysilicon structure, the second polysilicon structure, the monitoring pattern 3D structures, and the electrical contact.

14. The method of claim 10, wherein the at least one device region 3D transistor is a fin field effect transistor (FinFET) and the 3D structures are fins.

15. The method of claim 10, wherein the at least one seal ring includes a first inner seal ring and a second outer seal ring, and the monitoring pattern is disposed between the first inner seal ring and the second outer seal ring.

16. The method of claim 10, further comprising:
    forming a well that provides an electrical connection between the connecting region of the monitoring pattern and circuitry disposed in the device region.

17. A method of manufacturing an integrated circuit (IC), the method comprising:
    forming, in a device region of the semiconductor wafer, fins of fin field-effect transistors (finFETs) of the IC;
    forming, in a seal ring region surrounding the device region, at least one seal ring comprising fins encircling the device region and a monitoring pattern comprising fins encircling the device region;
    forming, in the device region, gates of the finFETs of the IC;
    forming polysilicon structures on the fins of the monitoring pattern in a connecting region of the monitoring pattern;
    epitaxially growing an epitaxial material on the fins of the monitoring pattern between the polysilicon structures; and
    forming at least one electrical contact that electrically contacts the epitaxial material.

18. The method of claim 17, further comprising:
    removing, between two adjacent polysilicon structures, a portion of the fins formed in the monitoring pattern, so that for each such fin, a first fin surface is established between the two adjacent polysilicon structures which is set back from a height of the fin remaining under the two adjacent polysilicon structures and a pair of fin side walls are exposed extending from the first fin surface to the height of the fin remaining under the two adjacent polysilicon structures;
    wherein the epitaxial material is grown on the fins of the monitoring pattern between the polysilicon structures by a combination of epitaxial growth upward from the first fin surfaces and epitaxial growth laterally inward from the fin side walls.

19. The method of claim 17 wherein the fins of the finFETs, the fins of the at least one seal ring, and the fins of the monitoring pattern are formed concurrently.

20. The method of claim 17 wherein the gates of the finFETs and the polysilicon structures are formed concurrently.

* * * * *